US012627267B1

(12) United States Patent
Khlat

(10) Patent No.: US 12,627,267 B1
(45) Date of Patent: May 12, 2026

(54) HYBRID POWER MANAGEMENT INTEGRATED CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 439 days.

(21) Appl. No.: 18/191,465

(22) Filed: Mar. 28, 2023

Related U.S. Application Data

(60) Provisional application No. 63/334,301, filed on Apr. 25, 2022.

(51) Int. Cl.
*H03F 3/21* (2006.01)
*H03F 1/02* (2006.01)
*H04B 1/04* (2006.01)

(52) U.S. Cl.
CPC ........... *H03F 3/211* (2013.01); *H03F 1/0222* (2013.01); *H03F 1/0288* (2013.01); *H04B 1/0458* (2013.01); *H03F 2200/451* (2013.01); *H04B 2001/045* (2013.01)

(58) Field of Classification Search
CPC ...... H03F 3/211; H03F 1/0222; H03F 1/0288; H03F 2200/451; H04B 1/0458; H04B 2001/045
USPC .......................................... 333/205; 330/205
See application file for complete search history.

(56) References Cited

U.S. PATENT DOCUMENTS

| | | | |
|---|---|---|---|
| 10,097,145 B1 | 10/2018 | Khlat et al. | |
| 10,103,926 B1 | 10/2018 | Khlat | |
| 10,270,345 B1 | 4/2019 | Kotikalapoodi | |
| 10,439,557 B2 | 10/2019 | Khlat et al. | |
| 10,523,120 B2 | 12/2019 | Youn et al. | |
| 10,790,786 B2 | 9/2020 | Henzler et al. | |
| 10,797,649 B2 | 10/2020 | Khlat | |
| 11,018,638 B2 | 5/2021 | Khlat et al. | |
| 11,108,363 B2 | 8/2021 | Khlat | |
| 11,165,393 B2 * | 11/2021 | Pehlke | ................. H04B 1/0475 |

(Continued)

FOREIGN PATENT DOCUMENTS

| | | |
|---|---|---|
| CN | 116505631 A | 7/2023 |
| WO | 2021262185 A1 | 12/2021 |

OTHER PUBLICATIONS

Extended European Search Report for European Patent Application No. 24166661.9, mailed Aug. 7, 2024, 8 pages.

*Primary Examiner* — Hafizur Rahman
(74) *Attorney, Agent, or Firm* — Withrow & Terranova, P.L.L.C.

(57) ABSTRACT

A hybrid power management integrated circuit (PMIC) is provided. The hybrid PMIC is configured to generate a modulated voltage. In an embodiment, the hybrid PMIC includes a carrier voltage amplifier and a peak voltage amplifier. The carrier voltage amplifier operates based on a lower supply voltage and is always active to generate the modulated voltage up to a threshold voltage. In contrast, the peak voltage amplifier operates based on a higher supply voltage and is only active when a peak of the modulated voltage is above the threshold voltage. Given that the peak of the modulated voltage can be lower than the threshold voltage most of time, the hybrid PMIC will be able to generate the modulated voltage primarily based on the carrier voltage amplifier that operates based on the lower supply voltage. As a result, the hybrid PMIC can achieve a higher operating efficiency.

21 Claims, 6 Drawing Sheets

(56)      References Cited

U.S. PATENT DOCUMENTS

| | | | |
|---|---|---|---|
| 11,349,436 | B2 | 5/2022 | Khlat |
| 11,424,719 | B2 | 8/2022 | Khlat |
| 11,637,531 | B1 | 4/2023 | Perrault et al. |
| 11,677,365 | B2 | 6/2023 | Khlat |
| 2009/0191826 | A1 | 7/2009 | Takinami et al. |
| 2012/0194274 | A1 | 8/2012 | Fowers et al. |
| 2016/0006397 | A1 | 1/2016 | Wimpenny |
| 2018/0034418 | A1* | 2/2018 | Blednov ................. H03F 3/195 |
| 2018/0309411 | A1* | 10/2018 | Cabrera .................. H03F 1/565 |
| 2020/0274494 | A1 | 8/2020 | Khlat |
| 2021/0083627 | A1* | 3/2021 | Sakata .................. H03F 1/0288 |
| 2021/0226585 | A1 | 7/2021 | Khlat |
| 2022/0200447 | A1 | 6/2022 | Khlat |
| 2023/0066436 | A1 | 3/2023 | Rutkowski |
| 2023/0118768 | A1 | 4/2023 | Khlat |
| 2023/0124941 | A1 | 4/2023 | Khlat |
| 2023/0216409 | A1 | 7/2023 | Ravi et al. |
| 2024/0014787 | A1 | 1/2024 | Khalt |

* cited by examiner

1

HYBRID POWER MANAGEMENT INTEGRATED CIRCUIT

RELATED APPLICATIONS

This application claims the benefit of U.S. provisional patent application Ser. No. 63/334,301, filed on Apr. 25, 2022, the disclosure of which is hereby incorporated herein by reference in its entirety.

FIELD OF THE DISCLOSURE

The technology of the disclosure relates generally to a power management integrated circuit (PMIC).

BACKGROUND

The fifth generation (5G) system has been widely regarded as the next generation wireless communication system beyond the current third generation (3G) and fourth generation (4G) systems. In this regard, a 5G-capable wireless communication device is expected to achieve higher data rates, improved coverage range, enhanced signaling efficiency, and reduced latency.

The 5G-capable wireless communication device typically includes multiple transmitters to simultaneously transmit multiple 5G radio frequency (RF) signals under such schemes as Carrier Aggregation (CA) and Evolved-Universal Terrestrial Radio Access (E-UTRA) New Radio (NR) Dual Connectivity (DC) (ENDC). Since the transmitters typically transmit the 5G RF signals in a millimeter wave spectrum, the RF signals can be more susceptible to propagation attenuation and interference. To help mitigate propagation attenuation and maintain desirable data throughput, the 5G-capable wireless communication device typically employs multiple power amplifiers to amplify the RF signals to desired power levels before transmitting the RF signals from the transmitters. As such, it is desirable to ensure that the power amplifiers can operate with optimal efficiency, especially when the RF signals are transmitted with different peak-to-average ratios (PARs).

SUMMARY

Embodiments of the disclosure relate to a hybrid power management integrated circuit (PMIC). The hybrid PMIC is configured to generate a modulated voltage that may correspond to different peak-to-average ratios (PARs). In an embodiment, the hybrid PMIC includes a carrier voltage amplifier and a peak voltage amplifier. The carrier voltage amplifier operates based on a lower supply voltage and is always active to generate the modulated voltage up to a threshold voltage. In contrast, the peak voltage amplifier operates based on a higher supply voltage and is only active when a peak of the modulated voltage is above the threshold voltage. Given that the peak of the modulated voltage can be lower than the threshold voltage most of time, the hybrid PMIC will be able to generate the modulated voltage primarily based on the carrier voltage amplifier that operates based on the lower supply voltage. As a result, the hybrid PMIC can achieve a higher operating efficiency.

In one aspect, a hybrid PMIC is provided. The hybrid PMIC includes a voltage output that outputs a modulated voltage. The hybrid PMIC also includes a switcher circuit coupled to the voltage output. The hybrid PMIC also includes a voltage merging node that represents an initial modulated voltage. The hybrid PMIC also includes an offset capacitor coupled between the voltage merging node and the voltage output. The hybrid PMIC also includes an impedance inverter circuit coupled to the voltage merging node. The hybrid PMIC also includes a carrier voltage amplifier coupled to the impedance inverter circuit. The hybrid PMIC also includes a peak voltage amplifier coupled to the voltage merging node. The hybrid PMIC also includes a supply voltage circuit coupled to the carrier voltage amplifier and the peak voltage amplifier.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
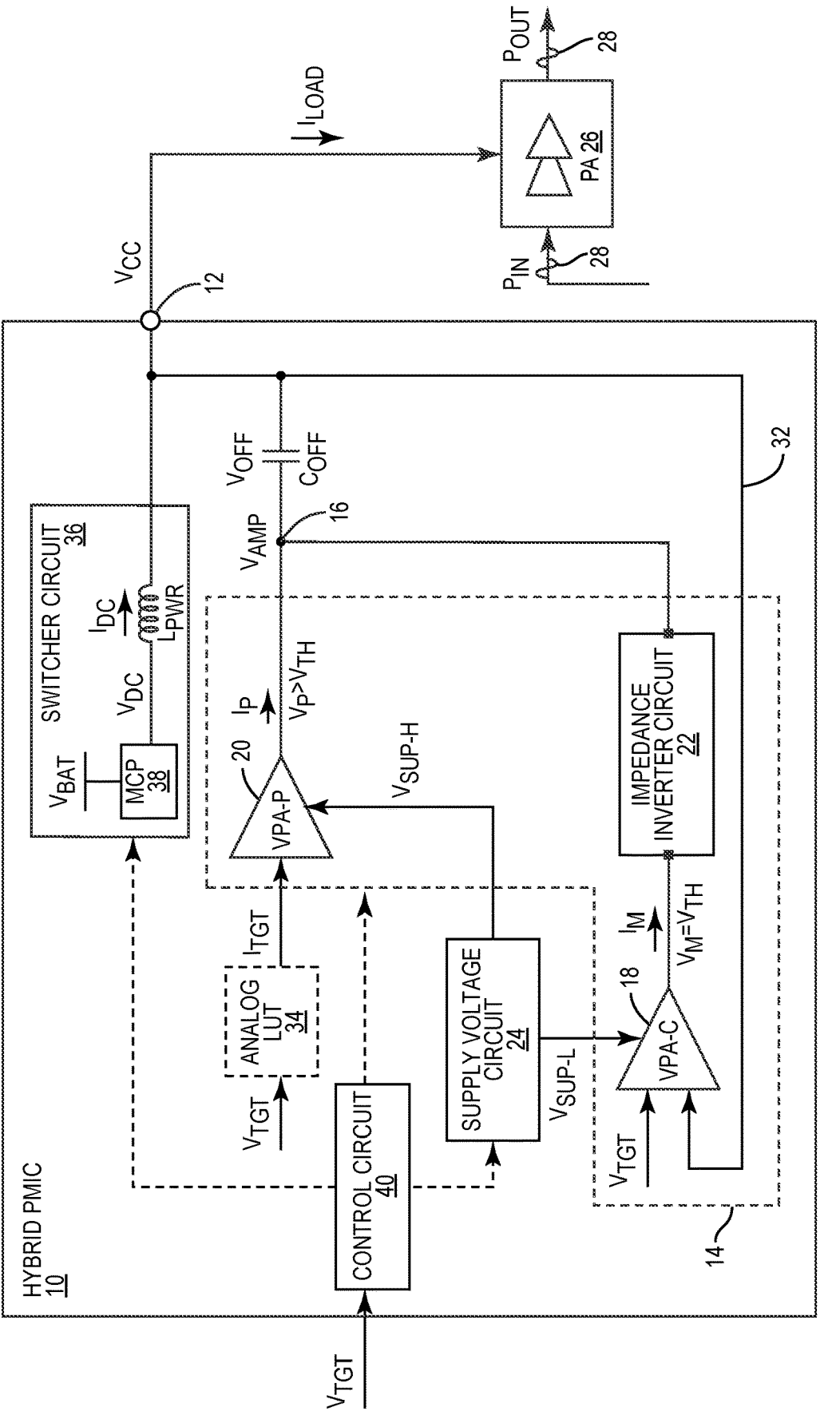
FIG. 1 is a schematic diagram of an exemplary hybrid power management integrated circuit (PMIC) configured according to an embodiment of the present disclosure to generate a modulated voltage.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a hybrid power management integrated circuit (PMIC). The hybrid PMIC is configured to generate a modulated voltage that may correspond to different peak-to-average ratios (PARs). In an embodiment, the hybrid PMIC includes a carrier voltage amplifier and a peak voltage amplifier. The carrier voltage amplifier operates based on a lower supply voltage and is always active to generate the modulated voltage up to a threshold voltage. In contrast, the peak voltage amplifier operates based on a higher supply voltage and is only active when a peak of the modulated voltage is above the threshold voltage. Given that the peak of the modulated voltage can be lower than the threshold voltage most of time, the hybrid PMIC will be able to generate the modulated voltage primarily based on the carrier voltage amplifier that operates based on the lower supply voltage. As a result, the hybrid PMIC can achieve a higher operating efficiency.

FIG. 1 is a schematic diagram of an exemplary hybrid PMIC 10 configured according to an embodiment of the present disclosure to generate a modulated voltage $V_{CC}$ at a voltage output 12. The hybrid PMIC 10 includes a voltage generation circuit 14 configured to generate an initial modulated voltage $V_{AMP}$ at a voltage merging node 16. In an embodiment, the voltage merging node 16 is coupled to the voltage output 12 via an offset capacitor $C_{OFF}$. The offset capacitor $C_{OFF}$ is configured to raise the initial modulated voltage $V_{AMP}$ by an offset voltage $V_{OFF}$ to thereby generate the modulated voltage $V_{CC}$ at the voltage output 12 ($V_{CC}=V_{AMP}+V_{OFF}$).

In an embodiment, the voltage generation circuit 14 includes a carrier voltage amplifier 18 (denoted as "VPA-C"), a peak voltage amplifier 20 (denoted as "VPA-P"), and an impedance inverter circuit 22. The peak voltage amplifier 20 and the impedance inverter circuit 22 are both coupled directly to the voltage merging node 16. The carrier voltage amplifier 18 is coupled to the voltage merging node 16 via the impedance inverter circuit 22. The carrier voltage amplifier 18 is configured to generate a first modulated voltage $V_M$ based on a modulated target voltage $V_{TGT}$ and a first supply voltage $V_{SUP-L}$. The peak voltage amplifier 20 is configured to generate a second modulated voltage $V_P$ based on the modulated target voltage $V_{TGT}$ and a second supply voltage $V_{SUP-H}$. The hybrid PMIC 10 is configured to further include a supply voltage circuit 24, which is configured to provide the first supply voltage $V_{SUP-L}$ and the second supply voltage $V_{SUP-H}$ to the carrier voltage amplifier 18 and the peak voltage amplifier 20, respectively.

In a non-limiting example, the voltage output 12 can be coupled to a power amplifier circuit 26 (denoted as "PA"). The power amplifier circuit 26, which can be any type of power amplifier (e.g., Doherty power amplifier, differential power amplifier, multi-state power amplifier, etc.), can be configured to amplify a radio frequency (RF) signal 28 from a time-variant input power PIN to a time-variant output power $P_{OUT}$ based on the modulated voltage $V_{CC}$.

Figure 2:
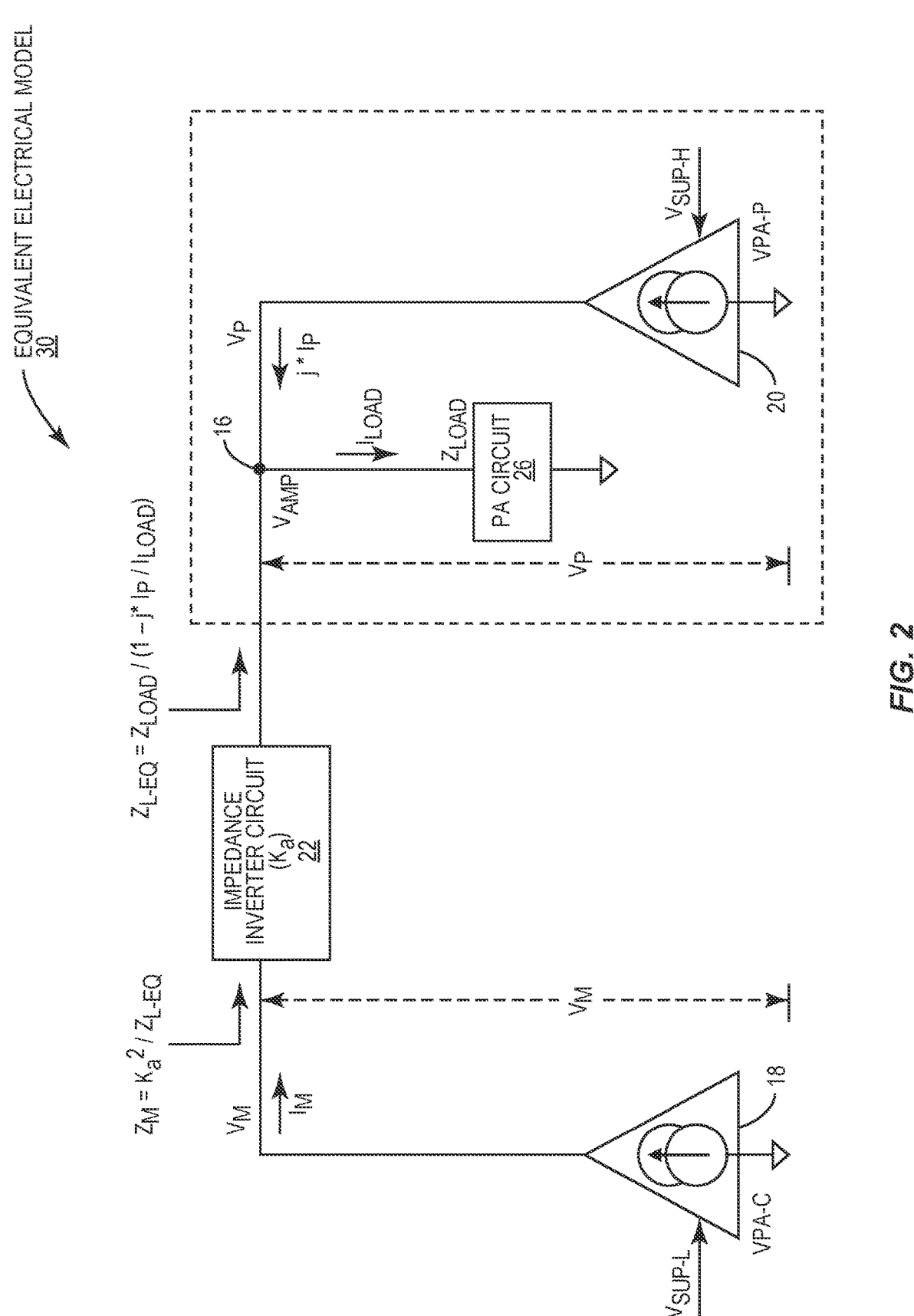
FIG. 2 is a schematic diagram illustrating an exemplary equivalent electrical model of a voltage generation circuit in the hybrid PMIC of FIG. 1.

The operational theory and principle behind the voltage generation circuit 14 can be better explained based on an equivalent electrical model. In this regard, FIG. 2 is a schematic diagram illustrating an exemplary equivalent electrical model 30 of the voltage generation circuit 14 in the hybrid PMIC 10 of FIG. 1. Common elements between FIGS. 1 and 2 are shown therein with common element numbers and will not be re-described herein.

The carrier voltage amplifier 18 generates a first modulated current $I_M$ in addition to the first modulated voltage $V_M$. Similarly, the peak voltage amplifier 20 generates a second modulated current $j*I_P$ in addition to the second modulated voltage $V_P$. A relationship between the second modulated voltage $V_P$ and the first modulated current $I_M$ can be expressed in the equation (Eq. 1) below.

$$V_P=K_a*I_M \qquad\qquad\text{(Eq. 1)}$$

In the equation (Eq. 1), Kα represents a coefficient of the impedance inverter circuit 22. An equivalent load impedance $Z_{L-EQ}$, which represents a total impedance of the power amplifier circuit 26 and the peak voltage amplifier 20, can be expressed as in the equation (Eq. 1) below.

$$Z_{L-EQ}=Z_{LOAD}/(1-j*I_P/I_{LOAD}) \qquad\text{(Eq. 2)}$$

In the above equation (Eq. 2), $Z_{LOAD}$ represents an inherent load impedance $Z_{LOAD}$ of the power amplifier circuit 26 and $I_{LOAD}$ represents a load current in the power amplifier circuit 26. When the peak voltage amplifier 20 is deactivated, the second modulated current $j*I_P$ will be zero ($j*I_P=0$). Accordingly, the equivalent load impedance $Z_{L\text{-}EQ}$ will only include the inherent load impedance $Z_{LOAD}$. However, when $j*I_P=\frac{1}{2} Z_{LOAD}$, for example, the equivalent load impedance $Z_{L\text{-}EQ}$ will change to $2*Z_{LOAD}$. In this regard, the equivalent load impedance $Z_{L\text{-}EQ}$ will increase when the peak voltage amplifier 20 is activated.

The impedance inverter circuit 22 is configured to convert the equivalent load impedance $Z_{L\text{-}EQ}$ into a modulated load impedance $Z_M$ in accordance with the equation (Eq. 3) below.

$$Z_M = -K_a^2/Z_{L\text{-}EQ} = -K_a^2*(1-j*I_P/I_{LOAD})/Z_{LOAD} \qquad \text{(Eq. 3)}$$

According to equation (Eq. 3), the modulated load impedance $Z_M$ will decrease when the equivalent load impedance $Z_{L\text{-}EQ}$ increases. In this regard, it is possible to reduce the modulated load impedance $Z_M$ by activating the peak voltage amplifier 20.

The first modulated voltage $V_M$ can be determined based on the equation (Eq. 4) below.

$$V_M = 4*Z_{LOAD}*(I_M-\frac{1}{2}I_P) \qquad \text{(Eq. 4)}$$

A derivative equation can be derived from the equation (Eq. 4), which is expressed below in equation (Eq. 5).

$$\Delta V_M = 4*Z_{LOAD}*(\Delta I_M-\frac{1}{2}\Delta I_P) \qquad \text{(Eq. 5)}$$

In the equation (Eq. 5), $\Delta V_M$, $\Delta I_M$, and $\Delta I_P$ represent a change in the first modulated voltage $V_M$, a change in the first modulated current $I_M$, and a change in the second modulated current $I_P$, respectively. Notably, when $\Delta I_P<2\Delta I_M$, $\Delta V_M$ will be greater than zero. In this regard, the first modulated voltage $V_M$ is non-constant, but increases at a lower rate. In contrast, when $\Delta I_P=2\Delta I_M$, $\Delta V_M$ will be zero, which indicates that the first modulated voltage $V_M$ is constant.

With reference back to FIG. 1, the carrier voltage amplifier 18 is always activated to generate the first modulated voltage $V_M$ at a constant level based on the first supply voltage $V_{SUP\text{-}L}$. In an embodiment, the carrier voltage amplifier 18 is configured to generate the first modulated voltage $V_M$ that equals a threshold voltage $V_{TH}$. In a non-limiting example, the threshold voltage $V_{TH}$ is equal to an average of the modulated voltage $V_{CC}$. Accordingly, the supply voltage circuit 24 is configured to generate the first supply voltage $V_{SUP\text{-}L}$ that corresponds to the average of the modulated voltage $V_{CC}$.

In contrast, the peak voltage amplifier 20 is only activated when the modulated voltage $V_{CC}$ is above the threshold voltage $V_{TH}$. When activated, the peak voltage amplifier 20 is configured to generate the second modulated voltage $V_P$ and the second modulated current $I_P$ based on the second supply voltage $V_{SUP\text{-}H}$. Accordingly, the supply voltage circuit 24 is configured to generate the second supply voltage $V_{SUP\text{-}H}$ that corresponds to a peak of the modulated voltage $V_{CC}$. Given that the peak of the modulated voltage $V_{CC}$ is higher than the average of the modulated voltage $V_{CC}$, the second supply voltage $V_{SUP\text{-}H}$ needs to be higher than the first supply voltage $V_{SUP\text{-}L}$.

In this regard, the hybrid PMIC 10 can be configured to generate the modulated voltage $V_{CC}$ from the carrier voltage amplifier 18 whenever the modulated voltage $V_{CC}$ is lower than or equal to the threshold voltage $V_{TH}$. As such, the initial modulated voltage $V_{AMP}$ at the voltage merging node 16 would be equal to the first modulated voltage $V_M$. Given that the carrier voltage amplifier 18 operates based on the first supply voltage $V_{SUP\text{-}L}$, which corresponds to the average of the modulated voltage $V_{CC}$, the carrier voltage amplifier 18 and, therefore, the hybrid PMIC 10, can operate at a higher efficiency.

When the modulated voltage $V_{CC}$ needs to be generated above the threshold voltage $V_{TH}$, the hybrid PMIC 10 will then rely on the peak voltage amplifier 20 to ramp up the modulated voltage $V_{CC}$ from the threshold voltage $V_{TH}$ to a desired level. As such, the initial modulated voltage $V_{AMP}$ at the voltage merging node 16 would be equal to a sum of the first modulated voltage $V_M$ and the second modulated voltage $V_P$. Given that the hybrid PMIC 10 only needs to increase the modulated voltage $V_{CC}$ from the threshold voltage $V_{TH}$ to the desired level, it is thus possible to ramp up the modulated voltage $V_{CC}$ in a timely fashion.

In addition to generating the first modulated voltage $V_M$ at the constant level, the carrier voltage amplifier 18 is also configured to dynamically adjust the first modulated current $I_M$ in accordance with rises and falls of the modulated voltage $V_{CC}$. In an embodiment, the hybrid PMIC 10 can include a feedback loop 32, which is configured to provide a feedback of the modulated voltage $V_{CC}$ to the carrier voltage amplifier 18. Accordingly, the carrier voltage amplifier 18 can compare the modulated target voltage $V_{TGT}$ with the feedback of the modulated voltage $V_{CC}$ to thereby adjust the first modulated current $I_M$ dynamically.

In an embodiment, the peak voltage amplifier 20 may dynamically adjust the second modulated current $I_P$ based on an analog lookup table (LUT) 34. In a non-limiting example, the analog LUT 34 can generate a modulated target current $I_{TGT}$ based on the modulated target voltage $V_{TGT}$. Accordingly, the peak voltage amplifier 20 can adapt the second modulated current $I_P$ dynamically.

The hybrid PMIC 10 further includes a switcher circuit 36 that is coupled to the voltage output 12. In an embodiment, the switcher circuit 36 includes a multi-level charge pump (MCP) 38 and a power inductor $L_{PWR}$. The MCP 38, which can be a direct-current (DC) buck-boost converter, for example, is configured to generate a low-frequency voltage $V_{DC}$ as a function of a battery voltage $V_{BAT}$. Specifically, the MCP 38 can operate in a buck mode to generate the low-frequency voltage $V_{DC}$ at $0 \times V_{BAT}$ or $1 \times V_{BAT}$, or in a boost mode to generate the low-frequency voltage $V_{DC}$ at $2 \times V_{BAT}$. Thus, by configuring the MCP 38 to operate based on a selected duty cycle, the MCP 38 can generate the low-frequency voltage $V_{DC}$ at multiple different levels.

The power inductor $L_{PWR}$ is coupled in series between the MCP 38 and the voltage output 12. Herein, the power inductor $L_{PWR}$ is configured to induce a low-frequency current $I_{DC}$ based on the low-frequency voltage $V_{DC}$. As such, the load current $I_{LOAD}$ would include the low-frequency current $I_{DC}$ and the first modulated current $I_M$ when the modulated voltage $V_{CC}$ is lower than or equal to the threshold voltage $V_{TH}$. In contrast, the load current $I_{LOAD}$ would include the low-frequency current $I_{DC}$, the first modulated current $I_M$, and the second modulated current $I_P$ when the modulated voltage $V_{CC}$ is higher than the threshold voltage $V_{TH}$.

In an embodiment, the hybrid PMIC 10 includes a control circuit 40, which can be a field-programmable gate array (FPGA) or an application-specific integrated circuit (ASIC), as an example. The control circuit 40 may be configured to control the supply voltage circuit 24 (e.g., setting respective levels of the first supply voltage $V_{SUP\text{-}L}$ and the second supply voltage $V_{SUP\text{-}H}$), the analog LUT 34 (e.g., determining values in the analog LUT), and/or the switcher circuit 36 (e.g., determining the selected duty cycle for the MCP 38) based on the modulated target voltage $V_{TGT}$.

Figure 3A:
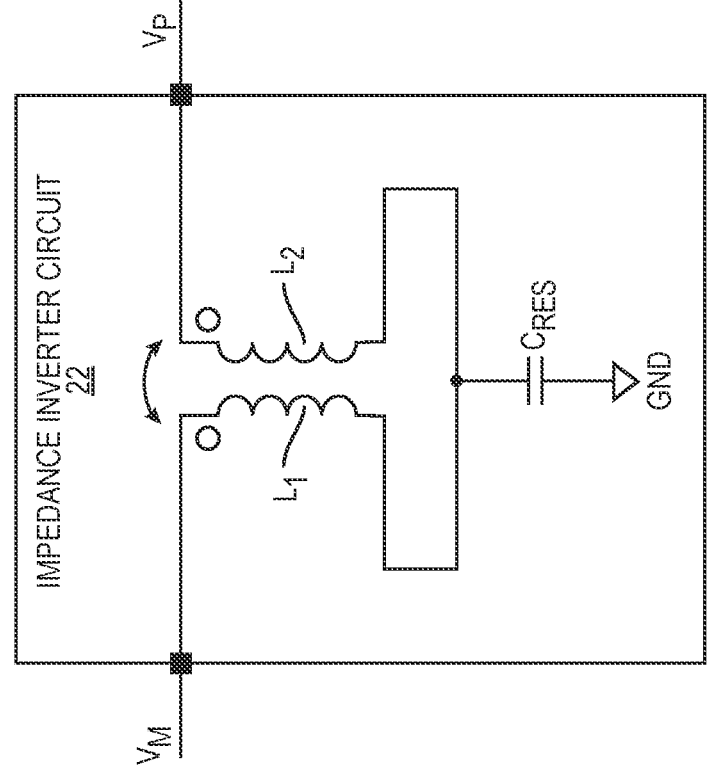
FIG. 3A is a schematic diagram of an impedance inverter circuit in the voltage generation circuit in the hybrid PMIC of FIG. 1 configured according to an embodiment of the present disclosure to operate at a baseband frequency.

In an embodiment, the hybrid PMIC 10 is configured to generate the modulated voltage $V_{CC}$ within a modulation bandwidth of the hybrid PMIC 10. In a non-limiting example, the modulation bandwidth of the hybrid PMIC 10 can range from a DC frequency of 0 to 400 MHz. As such, the carrier voltage amplifier 18 will have to generate the first modulated voltage $V_M$ and the first modulated current $I_M$, and the peak voltage amplifier 20 will have to generate the second modulated voltage $V_P$ and the second modulated current $I_P$ within the modulation bandwidth of the hybrid PMIC 10. Accordingly, the impedance inverter circuit 22 may be configured to operate in a baseband frequency of 0 to 400 MHz. In this regard, FIG. 3A is a schematic diagram of the impedance inverter circuit 22 in the hybrid PMIC 10 of FIG. 1 configured according to an embodiment of the present disclosure to operate at a baseband frequency.

In an embodiment, the impedance inverter circuit 22 includes a pair of negatively coupled inductors $L_1$ and $L_2$ and a resonance capacitor CRES. The resonance capacitor CRES is configured to resonate at the baseband frequency that falls within the modulation bandwidth of the hybrid PMIC 10.

Figure 3B:
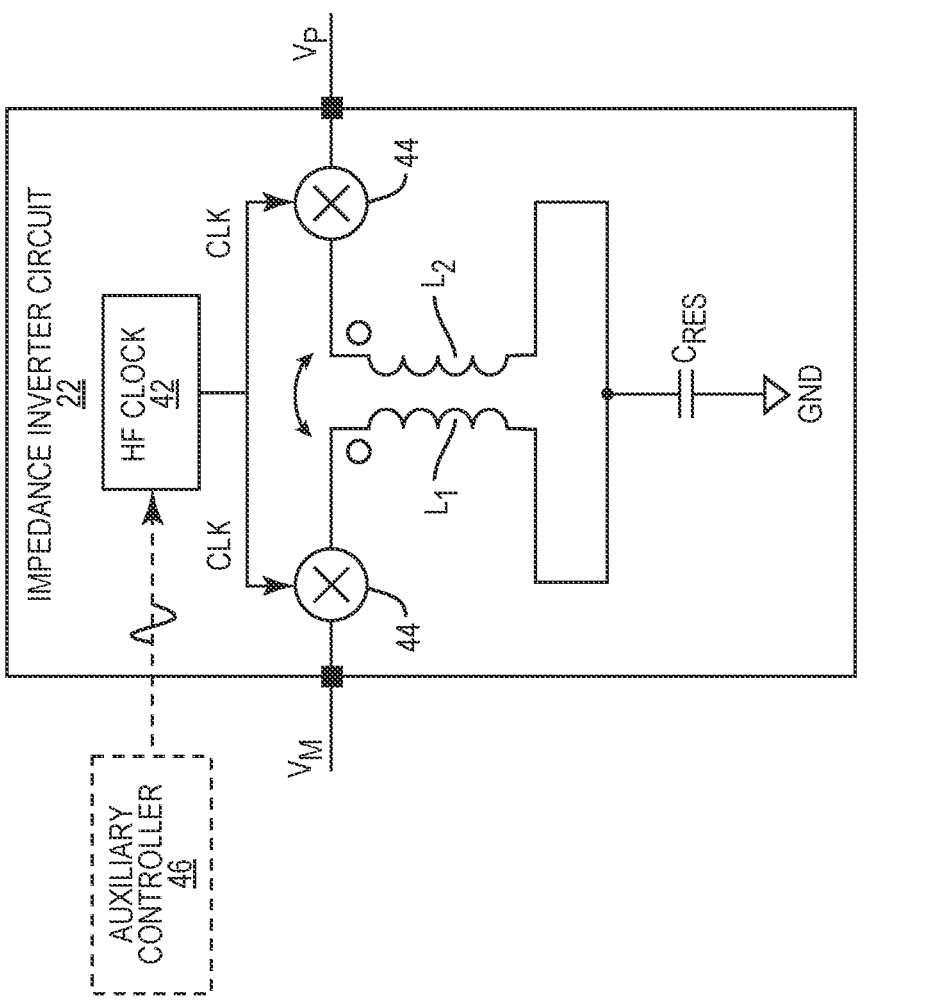
FIG. 3B is a schematic diagram of an impedance inverter circuit in the voltage generation circuit in the hybrid PMIC of FIG. 1 configured according to another embodiment of the present disclosure to operate at a modulated frequency.

Notably, when the impedance inverter circuit 22 is configured to operate at the baseband frequency, the inductors $L_1$ and $L_2$ may inevitably have a larger size. Thus, it may be desirable to reduce the size of the inductors $L_1$ and $L_2$ to thereby reduce the footprint of the impedance inverter circuit 22. In this regard, FIG. 3B is a schematic diagram of the impedance inverter circuit 22 in the hybrid PMIC 10 of FIG. 1 configured according to another embodiment of the present disclosure to operate at a modulated frequency higher than the baseband frequency. Common elements between FIGS. 3A and 3B are shown therein with common element numbers and will not be re-described herein.

In an embodiment, the impedance inverter circuit 22 in FIG. 3B further includes a high-frequency clock generator 42 (denoted as "HF CLOCK") and a pair of mixers 44. The high-frequency clock generator 42 is configured to generate a high-frequency reference clock CLK higher than the baseband frequency of the hybrid PMIC 10. The mixers 44 are coupled to the inductors $L_1$ and $L_2$, respectively. Herein, the mixers 44 are configured to operate based on the high-frequency reference clock CLK to convert the first modulated voltage $V_M$ and the second modulated voltage $V_P$ from the baseband frequency to the modulated frequency higher than the baseband frequency. Accordingly, the resonance capacitor CRES will resonate at the modulated frequency that falls outside the modulation bandwidth of the hybrid PMIC 10. By making the impedance inverter circuit 22 operate based on the higher modulated frequency, it is possible to reduce the size of the inductors $L_1$ and $L_2$, and therefore the footprint of the impedance inverter circuit 22.

In an embodiment, the high-frequency clock generator 42 may be coupled to an auxiliary controller 46. In a non-limiting example, the auxiliary controller 46 can be configured to perform such additional tasks as setting the high-frequency reference clock CLK, performing variable phase adjustment, and/or implementing clock dithering.

Figure 4:
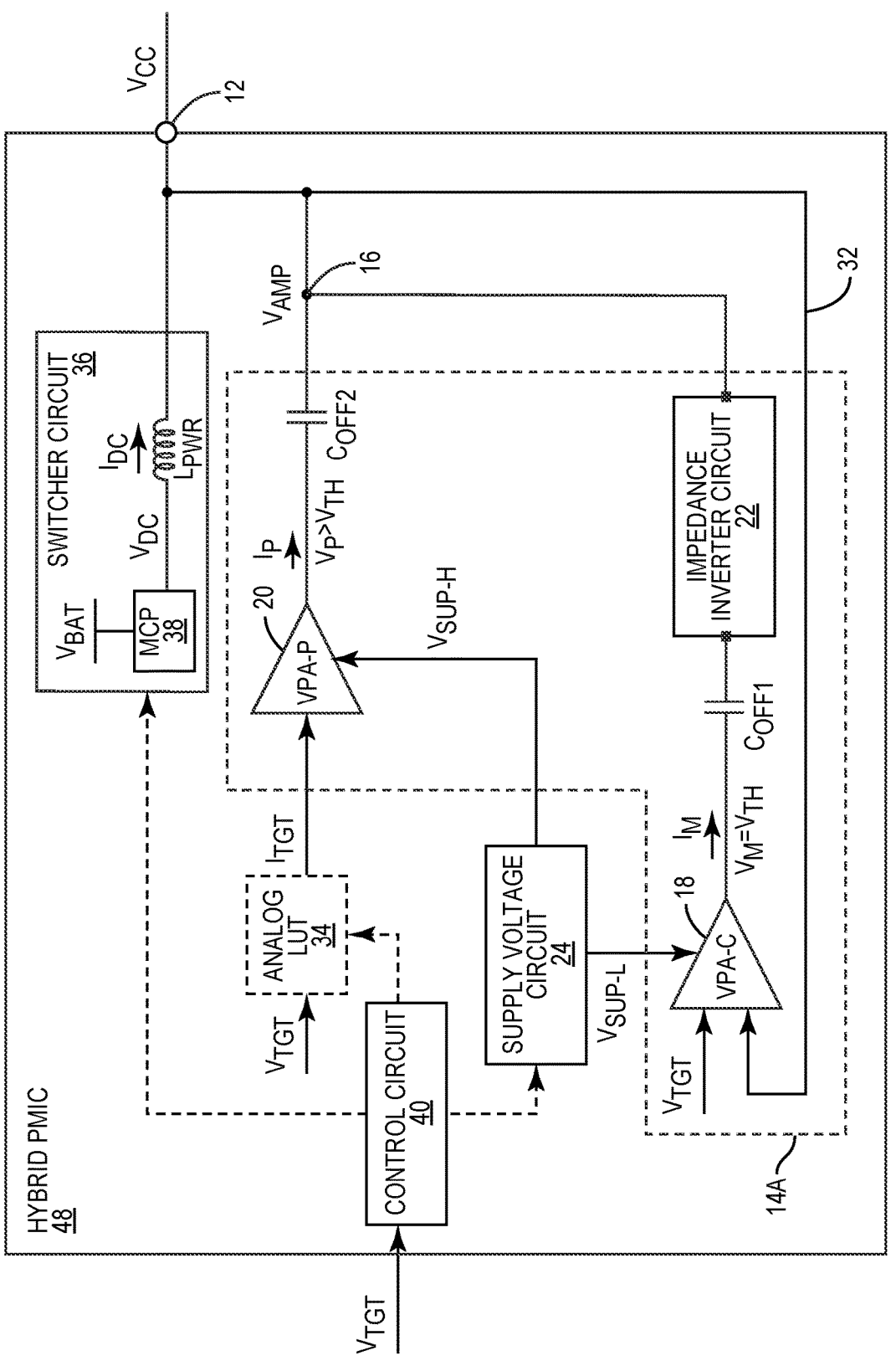
FIG. 4 is a schematic diagram of an exemplary hybrid PMIC configured according to an alternative embodiment of the present disclosure.

FIG. 4 is a schematic diagram of an exemplary hybrid PMIC 48 configured according to an alternative embodiment of the present disclosure. Common elements between FIGS. 1 and 4 are shown therein with common element numbers and will not be re-described herein.

In this embodiment, the hybrid PMIC 48 includes a voltage generation circuit 14A that includes the carrier voltage amplifier 18 and the peak voltage amplifier 20. The carrier voltage amplifier 18 is coupled to the impedance inverter circuit 22 via a first offset capacitor $C_{OFF1}$. The peak voltage amplifier 20 is coupled to the voltage merging node 16 via a second offset capacitor $C_{OFF2}$. The first offset capacitor $C_{OFF1}$ may have a respective capacitance that is identical to or different from a respective capacitance of the second offset capacitor $C_{OFF2}$.

Figure 5:
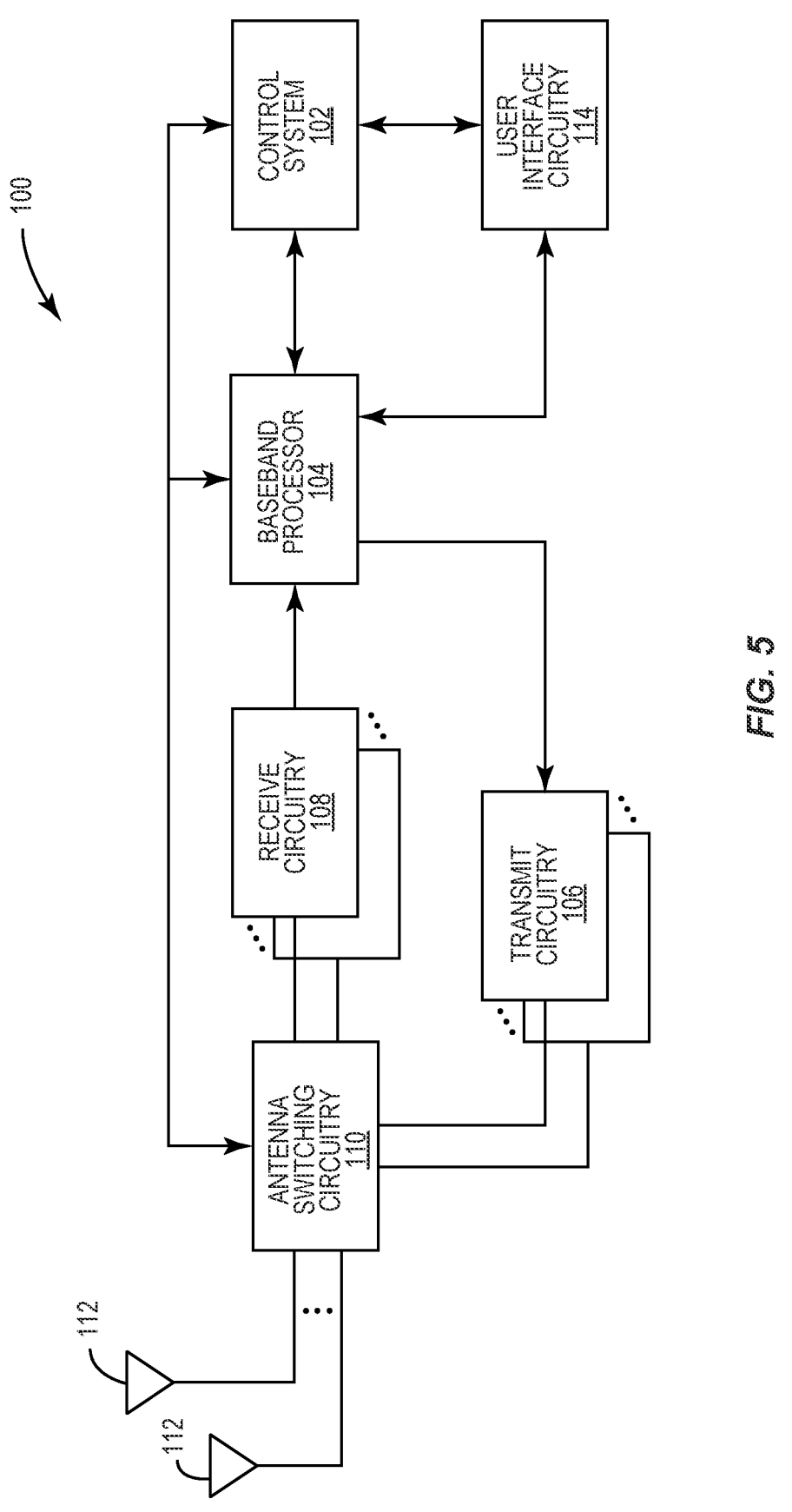
FIG. 5 is a schematic diagram of an exemplary user element wherein the hybrid PMICs of FIGS. 1 and 4 can be provided.

The hybrid PMIC 10 of FIG. 1 and the hybrid PMIC 48 of FIG. 4 can be provided in a user element according to embodiments described above. In this regard, FIG. 5 is a schematic diagram of an exemplary user element 100 wherein the hybrid PMIC 10 of FIG. 1 and the hybrid PMIC 48 of FIG. 4 can be provided.

Herein, the user element 100 can be any type of user elements, such as mobile terminals, smart watches, tablets, computers, navigation devices, access points, and like wireless communication devices that support wireless communications, such as cellular, wireless local area network (WLAN), Bluetooth, and near field communications. The user element 100 will generally include a control system 102, a baseband processor 104, transmit circuitry 106, receive circuitry 108, antenna switching circuitry 110, multiple antennas 112, and user interface circuitry 114. In a non-limiting example, the control system 102 can be a field-programmable gate array (FPGA), as an example. In this regard, the control system 102 can include at least a microprocessor(s), an embedded memory circuit(s), and a communication bus interface(s). The receive circuitry 108 receives radio frequency signals via the antennas 112 and through the antenna switching circuitry 110 from one or more base stations. A low noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams using analog-to-digital converter(s) (ADC).

The baseband processor 104 processes the digitized received signal to extract the information or data bits conveyed in the received signal. This processing typically comprises demodulation, decoding, and error correction operations, as will be discussed in greater detail below. The baseband processor 104 is generally implemented in one or more digital signal processors (DSPs) and application specific integrated circuits (ASICs).

For transmission, the baseband processor 104 receives digitized data, which may represent voice, data, or control information, from the control system 102, which it encodes for transmission. The encoded data is output to the transmit circuitry 106, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission, and deliver the modulated carrier signal to the antennas 112 through the antenna switching circuitry 110. The multiple antennas 112 and the replicated transmit and receive circuitries 106, 108 may provide spatial diversity. Modulation and processing details will be understood by those skilled in the art.

Those skilled in the art will recognize improvements and modifications to the preferred embodiments of the present disclosure. All such improvements and modifications are considered within the scope of the concepts disclosed herein and the claims that follow.

What is claimed is:

1. A hybrid power management integrated circuit (PMIC) comprising:
    a voltage merging node coupled to a voltage output that outputs a modulated voltage;
    a voltage generation circuit comprising:

a carrier voltage amplifier configured to generate a first modulated voltage based on a modulated target voltage and a first supply voltage; and a peak voltage amplifier configured to generate a second modulated voltage based on the modulated target voltage and a second supply voltage higher than the first supply voltage; and a control circuit configured to:

cause the voltage generation circuit to generate an initial modulated voltage comprising the first modulated voltage at the voltage merging node when a peak of the modulated voltage is lower than or equal to a threshold voltage; and cause the voltage generation circuit to generate the initial modulated voltage comprising the first modulated voltage and the second modulated voltage at the voltage merging node when the peak of the modulated voltage is higher than the threshold voltage.

2. The hybrid PMIC of claim 1, wherein the threshold voltage is equal to an average of the modulated voltage.

3. The hybrid PMIC of claim 1, wherein:

the carrier voltage amplifier is coupled to the voltage merging node via an impedance inverter circuit; and the peak voltage amplifier is coupled directly to the voltage merging node.

4. The hybrid PMIC of claim 3, further comprising:

an offset capacitor coupled between the voltage merging node and the voltage output and configured to raise the initial modulated voltage by an offset voltage to thereby generate the modulated voltage at the voltage output; and a supply voltage circuit configured to provide the first supply voltage to the carrier voltage amplifier and provide the second supply voltage to the peak voltage amplifier.

5. The hybrid PMIC of claim 4, further comprising a switcher circuit comprising:

a multi-level charge pump (MCP) configured according to a selected duty cycle to generate a low-frequency voltage as a function of a battery voltage; and a power inductor configured to induce a low-frequency current at the voltage output based on the low-frequency voltage.

6. The hybrid PMIC of claim 4, wherein:

the carrier voltage amplifier is always activated to generate the first modulated voltage at a constant level at the voltage merging node; and the control circuit is configured to:

activate the peak voltage amplifier to generate the second modulated voltage at the voltage merging node when the peak of the modulated voltage is higher than the threshold voltage; and deactivate the peak voltage amplifier when the peak of the modulated voltage is lower than or equal to the threshold voltage.

7. The hybrid PMIC of claim 3, wherein the carrier voltage amplifier is further configured to:

generate a first modulated current at the voltage merging node; and dynamically adjust the first modulated current based on feedback of the modulated voltage.

8. The hybrid PMIC of claim 3, wherein the peak voltage amplifier is further configured to:

generate a second modulated current at the voltage merging node; and

dynamically adjust the second modulated current based on an analog lookup table (LUT).

9. The hybrid PMIC of claim 3, wherein the carrier voltage amplifier and the peak voltage amplifier are further configured to generate the first modulated voltage and the second modulated voltage, respectively, in a baseband frequency that falls within a modulation bandwidth of the hybrid PMIC.

10. The hybrid PMIC of claim 9, wherein the impedance inverter circuit is configured to operate in the baseband frequency.

11. The hybrid PMIC of claim 9, wherein the impedance inverter circuit is configured to operate at a modulated frequency higher than the baseband frequency.

12. The hybrid PMIC of claim 11, wherein the impedance inverter circuit comprises:

a high-frequency clock generator configured to generate a high-frequency reference clock higher than the baseband frequency; and a pair of mixers configured to operate based on the high-frequency reference clock to convert the first modulated voltage and the second modulated voltage from the baseband frequency to the modulated frequency.

13. The hybrid PMIC of claim 1, wherein:

the carrier voltage amplifier is coupled to the voltage merging node via a first offset capacitor and an impedance inverter circuit; and the peak voltage amplifier is coupled to the voltage merging node via a second offset capacitor.

14. The hybrid PMIC of claim 13, further comprising a supply voltage circuit configured to provide the first supply voltage to the carrier voltage amplifier and provide the second supply voltage to the peak voltage amplifier.

15. The hybrid PMIC of claim 14, wherein:

the carrier voltage amplifier is always activated to generate the first modulated voltage at a constant level at the voltage merging node; and the control circuit is configured to:

activate the peak voltage amplifier to generate the second modulated voltage at the voltage merging node when the peak of the modulated voltage is higher than the threshold voltage; and deactivate the peak voltage amplifier when the peak of the modulated voltage is lower than or equal to the threshold voltage.

16. The hybrid PMIC of claim 13, wherein the carrier voltage amplifier is further configured to:

generate a first modulated current at the voltage merging node; and dynamically adjust the first modulated current based on feedback of the modulated voltage.

17. The hybrid PMIC of claim 13, wherein the peak voltage amplifier is further configured to:

generate a second modulated current at the voltage merging node; and dynamically adjust the second modulated current based on an analog lookup table (LUT).

18. The hybrid PMIC of claim 13, wherein the carrier voltage amplifier and the peak voltage amplifier are further configured to generate the first modulated voltage and the second modulated voltage, respectively, in a baseband frequency that falls within a modulation bandwidth of the hybrid PMIC.

19. The hybrid PMIC of claim 18, wherein the impedance inverter circuit is configured to operate in the baseband frequency.

20. The hybrid PMIC of claim 19, wherein the impedance inverter circuit is configured to operate at a modulated frequency higher than the baseband frequency.

21. A wireless device comprising a hybrid power management integrated circuit (PMIC), the hybrid PMIC comprises:

a voltage merging node coupled to a voltage output that outputs a modulated voltage;

a voltage generation circuit comprising:

a carrier voltage amplifier configured to generate a first modulated voltage based on a modulated target voltage and a first supply voltage; and a peak voltage amplifier configured to generate a second modulated voltage based on the modulated target voltage and a second supply voltage higher than the first supply voltage; and a control circuit configured to:

cause the voltage generation circuit to generate an initial modulated voltage comprising the first modulated voltage at the voltage merging node when a peak of the modulated voltage is lower than or equal to a threshold voltage; and cause the voltage generation circuit to generate the initial modulated voltage comprising the first modulated voltage and the second modulated voltage at the voltage merging node when the peak of the modulated voltage is higher than the threshold voltage.

\*    \*    \*    \*    \*